(12) United States Patent
Alpert et al.

(10) Patent No.: US 8,015,532 B2
(45) Date of Patent: Sep. 6, 2011

(54) OPTIMAL TIMING-DRIVEN CLONING UNDER LINEAR DELAY MODEL

(75) Inventors: Charles J. Alpert, Cedar Park, TX (US); Zhuo Li, Cedar Park, TX (US); David A. Papa, Austin, TX (US); Chin Ngai Sze, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 558 days.

(21) Appl. No.: 11/938,824

(22) Filed: Nov. 13, 2007

(65) Prior Publication Data

US 2009/0125859 A1    May 14, 2009

(51) Int. Cl.
*G06F 17/50*    (2006.01)
(52) U.S. Cl. .................. 716/125; 716/122; 716/134
(58) Field of Classification Search .................. 716/6, 7, 716/10, 2
See application file for complete search history.

(56) References Cited

U.S. PATENT DOCUMENTS

| | | | |
|---|---|---|---|
| 6,286,128 B1 | 9/2001 | Pileggi et al. | |
| 7,100,144 B2 | 8/2006 | Jacobson et al. | |
| 7,111,266 B2 | 9/2006 | Correale, Jr. et al. | |
| 7,290,239 B1 * | 10/2007 | Singh et al. ..................... | 716/18 |
| 2006/0095879 A1 * | 5/2006 | Brahme et al. ..................... | 716/6 |
| 2006/0190224 A1 * | 8/2006 | Allen et al. ........................ | 703/2 |
| 2007/0271543 A1 * | 11/2007 | Alpert et al. ..................... | 716/13 |
| 2009/0064069 A1 * | 3/2009 | Koehl et al. ........................ | 716/6 |

OTHER PUBLICATIONS

J. Lillis et al., "Algorithms for Optimal Introduction of Redundant Logic for timing and Area Optimization," IEEE Int'l. Sym. on Circuits and Systems, vol. 4, pp. 452-455 (May 1996).
A. Srivastava et al., "Timing Driven Gate Duplication: Complexity Issues and Algorithms," IEEE/ACM Int'l. Conf. on Computer Aided Design, pp. 447-450 (2000).

* cited by examiner

*Primary Examiner* — Paul Dinh
*Assistant Examiner* — Patrick Sandoval
(74) *Attorney, Agent, or Firm* — Libby Z. Toub; Jack V. Musgrove

(57) ABSTRACT

A timing-driven cloning method iteratively partitions sinks of the net into different sets of clusters and for each set computes a figure of merit for a cloned gate location which optimizes timing based on linear delay, that is, a delay proportional to the distance between the cloned gate location and the sinks. The set having the highest figure of merit is selected as the best solution. The original gate may also be moved to a timing-optimized location. The sinks are advantageously partitioned using boundaries of Voronoi polygons defined by a diamond region surrounding the original gate, or vice versa. The figure of merit may be for example worst slack, a sum of slacks at the sinks in the second cluster, or a linear combination of worst slack and sum of the slacks.

18 Claims, 6 Drawing Sheets

OPTIMAL TIMING-DRIVEN CLONING UNDER LINEAR DELAY MODEL

BACKGROUND OF THE INVENTION

1. Field of the Invention

The present invention generally relates to the design of semiconductor chips and integrated circuits, and more particularly to the use of cloning techniques to manage timing requirements in an integrated circuit design.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a netlist, which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of an electrical circuit into a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction.

Physical synthesis is prominent in the automated design of integrated circuits such as high performance processors and application specific integrated circuits (ASICs). Physical synthesis is the process of concurrently optimizing placement, timing, power consumption, crosstalk effects and the like in an integrated circuit design. This comprehensive approach helps to eliminate iterations between circuit analysis and place-and-route. Physical synthesis has the ability to repower gates (changing their sizes), insert repeaters (buffers or inverters), clone gates or other combinational logic, etc., so the area of logic in the design remains fluid. However, physical synthesis can take days to complete, and the computational requirements are increasing as designs are ever larger and more gates need to be placed. There are also more chances for bad placements due to limited area resources.

Faster performance and predictability of responses are elements of interest in circuit designs. As process technology scales to the submicron regime, interconnect delays increasingly dominate gate delays. Consequently, physical design optimization tools such as floorplanning, placement, and routing are becoming more timing-driven than the previous generation of tools. Different optimization techniques are used to fix bad timing behaviors during physical synthesis. Cloning is an optimization technique that can fix some timing problems that other optimization techniques (buffer insertion, repowering) cannot. Cloning takes an original gate and duplicates it for use with a portion of the circuit. The inputs of the original gate and the duplicate are the same.

A simplified cloning example is illustrated in FIGS. 1A and 1B. Circuit 2 of FIG. 1A includes two inputs (sources) 4a, 4b, an OR gate 6, and two outputs (sinks) 8a, 8b. The sources and sinks may be latches. In this example the location of OR gate 6 is fixed. The numbers "1" and "3" are the delay values for those segments of the circuit. Due to the location of OR gate 6 closer to sink 8a, the slack at sink 8a (the difference between the actual propagation time and the maximum allowable time) is 1, while the slack at sink 8b is −1. A negative slack value indicates that the signal will actually arrive after its required arrival time, i.e., a timing violation. As seen in FIG. 2B, cloning solves this violation by adding another OR gate 6' to create a modified circuit 2' wherein each gate 6, 6' receives inputs from both sources 4a, 4b, but gate 6 provides an output only to sink 8a while gate 6' provides an output to sink 8b and is located closer to sink 8b. The result is the same (positive) slack for both sinks.

Timing closure is an important problem for ASIC and server designs with 90 nm technology and beyond. While cloning is useful for solving some timing problems, it is not particularly efficient. Prior art cloning uses gate delay models (the delay through a gate is proportional to the total capacitances of gates which it drives), ignoring the interconnect delay and physical layout information, and does not determine an optimum location of the duplicated gate. For example, if the cloned gate 6' in FIG. 1B had been placed too near the original gate 6, the net would still exhibit poor slack. Existing cloning techniques have difficulty even determining a good partition where there are many sinks in the net. It would, therefore, be desirable to devise a cloning method which provided improved timing closure. It would be further advantageous if the improved cloning method could achieve optimal timing with high computational efficiency.

SUMMARY OF THE INVENTION

It is therefore one object of the present invention to provide an improved cloning method for use in designing the layout of an integrated circuit which is timing-driven.

It is another object of the present invention to provide such timing-driven cloning that can be used with interconnect modeling and buffering.

It is yet another object of the present invention to provide a method for optimal timing-driven cloning which is computationally efficient.

The foregoing objects are achieved in a method of cloning an original gate in a circuit design, by receiving a description of the circuit design which includes locations for sources and sinks of the original gate, iteratively partitioning the sinks into different sets of clusters wherein the original gate is assigned to a first one of the clusters in a given set and at least one cloned gate is assigned to a second one of the clusters in the given set, for each set of clusters computing a figure of merit for a location of the cloned gate which optimizes timing based on delay that is proportional to a distance between the cloned gate location and the location of a given sink in the second cluster, selecting one of the sets of clusters having a highest figure of merit as a best solution, and storing the description of the circuit design with a final location of the cloned gate corresponding to the best solution. The location of the original gate may also be changed to a new location which optimizes timing based on delay that is proportional to the distance between the new location and the location of a given sink in the first cluster. The sinks are advantageously partitioned using boundaries of Voronoi polygons defined by candidate clone locations and a diamond region surrounding the original gate, or the vice versa. The figure of merit may be for example worst slack, a sum of slacks at the sinks in the second cluster, or some combination of worst slack and sum of the slacks.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1A:
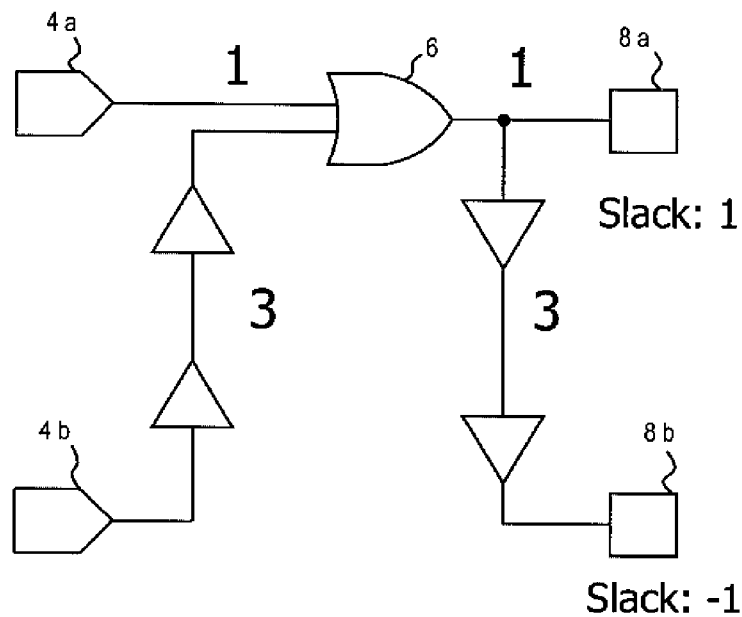
FIGS. 1A and 1B are schematic diagrams of a simplified net having two sources, a gate and two sinks, illustrating conventional cloning of the gate to improve slack.
Figure 1B:
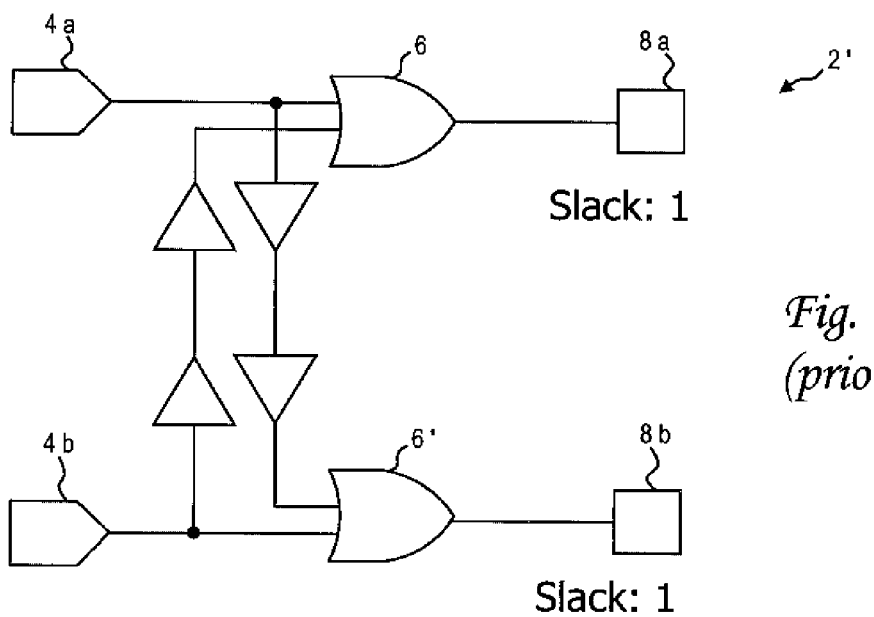
Figure 2:
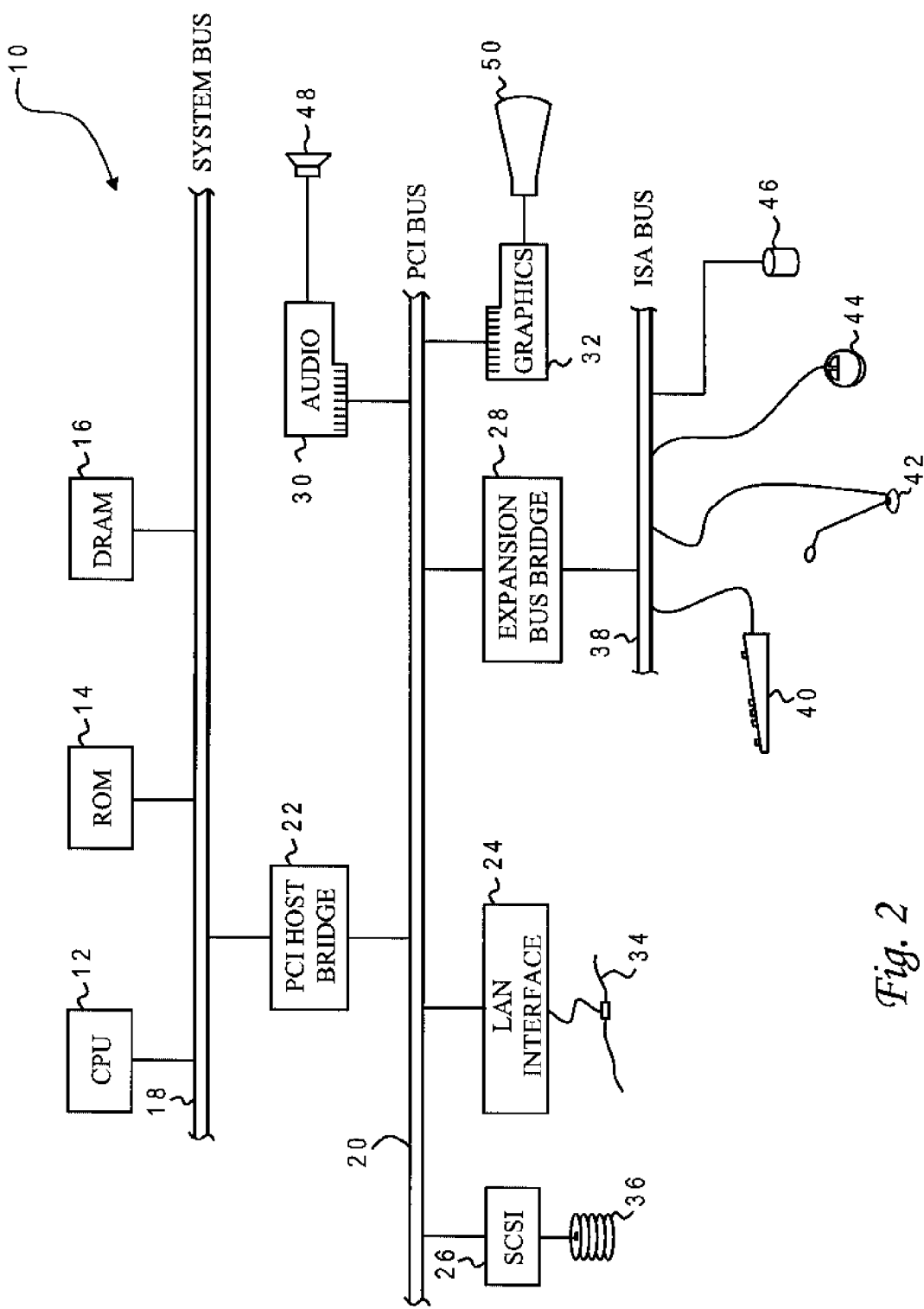
FIG. 2 is a block diagram of a computer system programmed to carry out computer-aided design of an integrated circuit in accordance with one embodiment of the present invention.

With reference now to the figures, and in particular with reference to FIG. 2, there is depicted one embodiment 10 of a computer system programmed to carry out timing-driven cloning in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches. In high performance implementations, system 10 may include multiple CPUs and a distributed system memory.

CPU 12, ROM 14 and DRAM 16 are coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below and results of the circuit design (intermediate or final). Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the buffer insertion as taught herein.

While the illustrative implementation provides the program instructions embodying the present invention on disk drive 36, those skilled in the art will appreciate that the invention can be embodied in a program product utilizing other non-transitory computer-readable media, excluding transitory media such as propagating signals. The program instructions may be written in the C++ programming language for an AIX environment. Computer system 10 carries out program instructions for an interconnect optimization process that uses novel cloning techniques to manage timing requirements. Accordingly, a program embodying the invention may include conventional aspects of various placement and timing tools, and these details will become apparent to those skilled in the art upon reference to this disclosure.

The present invention provides an improved cloning method which may be used to optimize the timing of a net in polynomial computation time. The invention examines certain possible partitions of the sinks of the output net, and uses a linear delay model to solve for the optimal location of the cloned gate for each partition (and the location of the original gate if it is movable). The linear delay model is applied to the net without any repeaters (buffers or inverters) ignoring Steiner tree effects, and repeaters may be inserted after gate location.

Figure 3A:
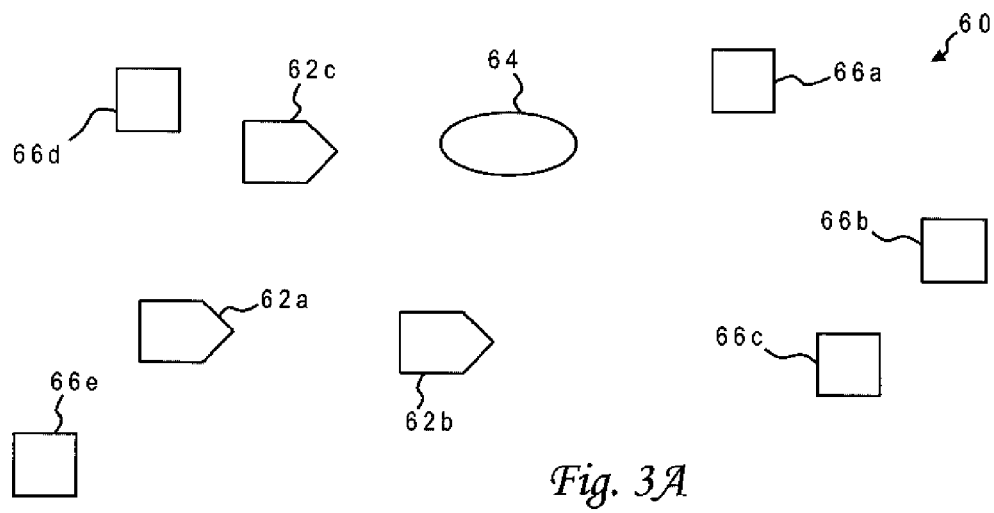
FIGS. 3A-3D are schematic diagrams of a simplified subcircuit having three sources, a gate, and five sinks which are partitioned into two groups according to one implementation of the timing-driven cloning method of the present invention.
Figure 3B:
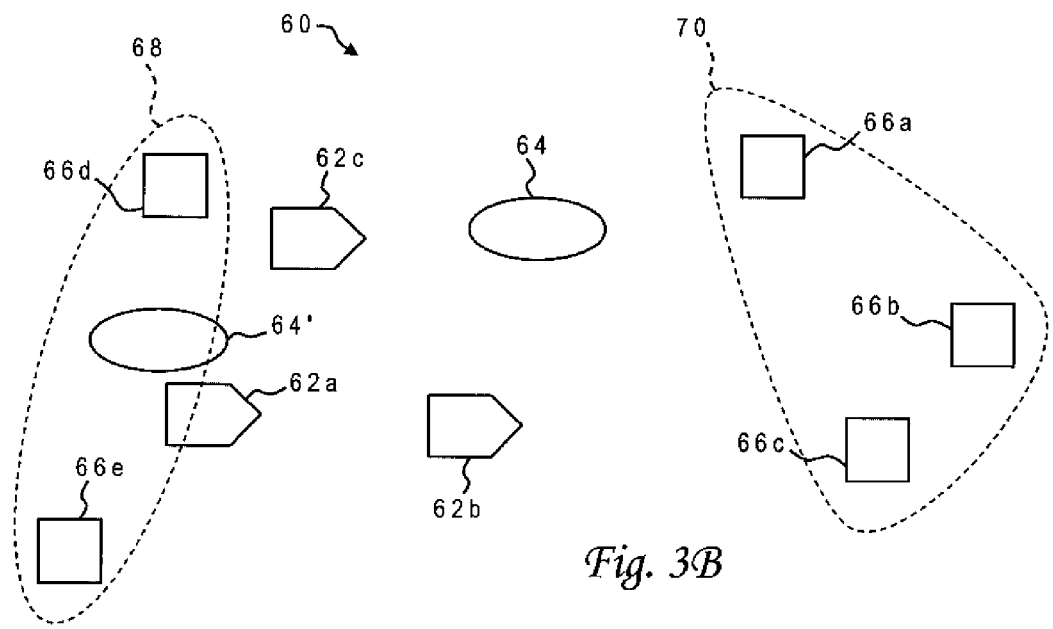

One example of timing-driven cloning according to the present invention is illustrated in FIGS. 3A-3D. A subcircuit 60 includes fan-ins (sources) 62a, 62b, 62c, a gate 64, and fan-outs (sinks) 66a, 66b, 66c, 66d, 66e. The sources and sinks may be other gates or latches. The locations of these components of subcircuit 60 as seen in FIG. 3A are provided by a previous EDA tool in the physical synthesis process or by manual placement by the designer, or can simply be a random layout for the circuit elements. Physical synthesis includes many steps such as an initial quadratic placement which minimizes wire length, followed by early optimizations, driven placements, late optimizations, and detailed placement. Timing-driven cloning according to the present invention may be utilized at various steps in this process, for example, following late optimization or detailed placement.

Different criteria may be used for initially deciding when to carry out cloning for a net. Cloning is considered desirable for any net exhibiting particularly poor slack or having highly imbalanced slack, i.e., a large deviation between input and output slacks, particularly a positive slack at the input(s) and a negative slack at the output(s). If the design criteria establish that cloning is desirable for subcircuit 60, the first step is to partition sinks 66a, 66b, 66c, 66d, 66e into two or more clusters. This grouping of the sinks is preferably carried out using the Voronoi diagram methods described below in conjunction with FIGS. 4A & 4B. In this example one result is a partition having two clusters 68, 70 shown in FIG. 3B. Cluster 68 includes sinks 66d and 66e, while cluster 70 includes sinks 66a, 66b and 66c. Original gate 64 is assigned to cluster 70, and a cloned gate 64' is assigned to cluster 68. Cloned gate 64' is a duplicate of the logic in original gate 64 and may include a single gate or several interconnected gates such as AND, OR, NAND, NOR, and XOR gates or higher-level functions.

Once the set of clusters has been selected, the problem of gate location is solved by modeling delay as a linear (proportional) function of distance from the gate to the sources and to the sinks it is assigned to. Computer system 10 computes the slack for each candidate location of the cloned gate. Slack at a given source i is computed as $S_i=RAT_g-AAT_i-D_i$, where $RAT_g$ is the required arrival time at the gate, $AAT_i$ is the actual arrival time at the source, and $D_i$ is the linear delay between the source and the gate. Slack at a given sink j is computed as $S_j=RAT_j-AAT_g-D_j$, where $RAT_j$ is the required arrival time at sink j, $AAT_g$ is the actual arrival time at the driving gate, and $D_j$ is the linear delay between the gate and the sink. The candidate location having the maximum worst slack is chosen for cloned gate 64', in other words, the location that represents the best timing solution for that sub-net. For example, if the worst slack for a set of possible locations of cloned gate 64' based on a linear delay model varied from −0.5 nanoseconds to +0.1 nanoseconds, then the location corresponding to the worst slack of +0.1 nanoseconds would be chosen as the final gate location. While the illustrative embodiment optimizes timing based on worst slack, the designer can instead choose the best timing solution based on some other figure of merit (FOM), for example, the sum of the slacks at the sinks of the cloned gate, or some combination (e.g., linear) of the sum of the slacks and the worst slack.

The proportionality of the linear delay may vary considerably depending on the fabrication technology and wiring parameters. The following delays are considered exemplary for metal layer M3: for 130 nm technology, the delay used is 190 ps/mm; for 90 nm technology, the delay used is 240 ps/mm; and for 65 nm technology, the delay used is 320 ps/mm.

Figure 3C:
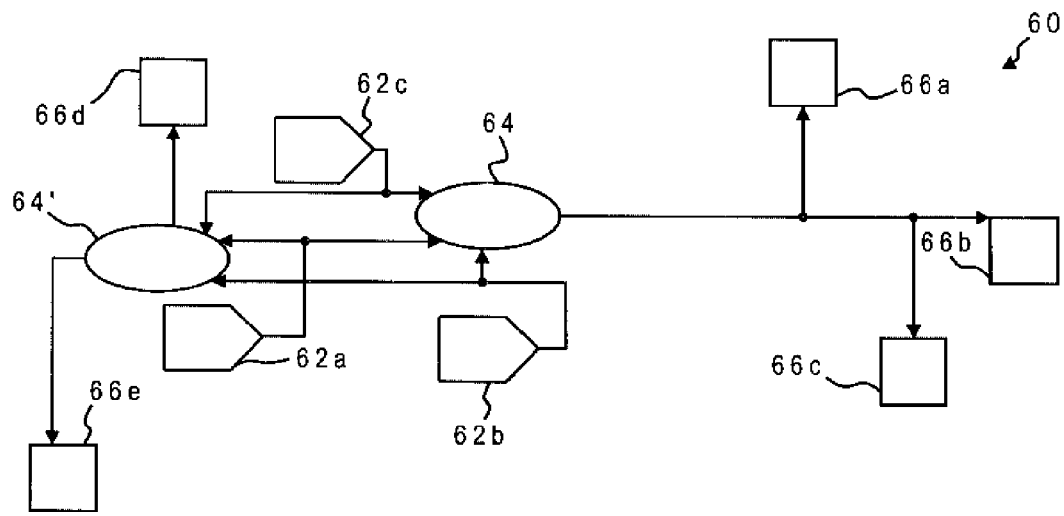

If the location of original gate 64 is not constrained, this same linear delay model is used to find an optimal location of original gate 64. FIG. 3C shows gates 64, 64' in these optimal locations. The locations of sources 62a, 62b, 62c, and sinks 66a, 66b, 66c, 66d, 66e are identical to the original locations provided by the prior placement (FIG. 3A); however, those skilled in the art will appreciate that further refinements might ultimately place the sources or sinks at different locations.

Figure 3D:
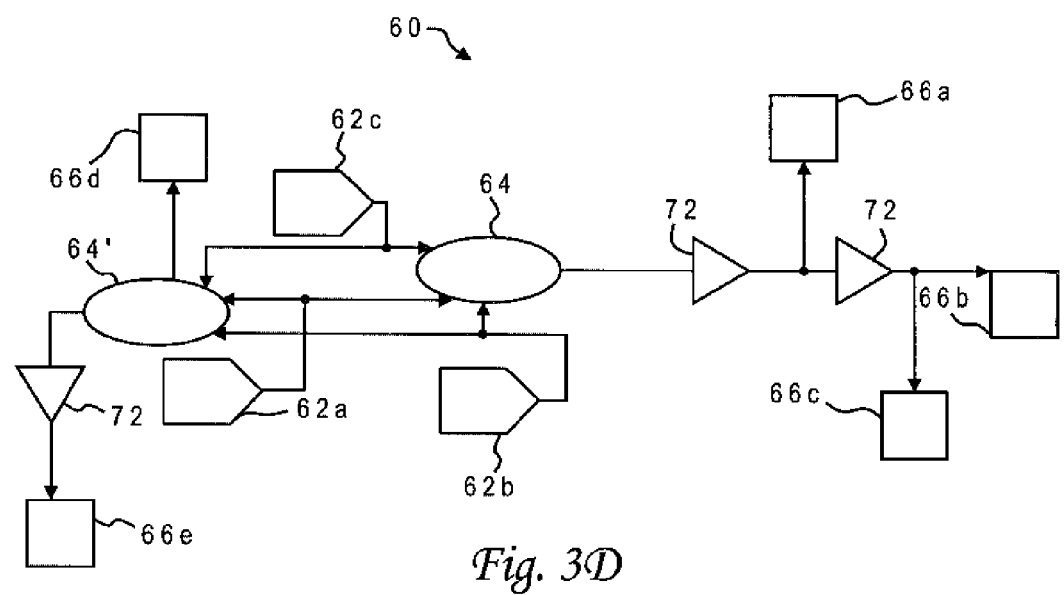

After the cloned and original gates have been located, repeaters 72 are inserted to achieve final timing closure as seen in FIG. 3D. The sizes and locations of repeaters 72 may be computed according to known buffer insertion techniques.

Figure 4A:
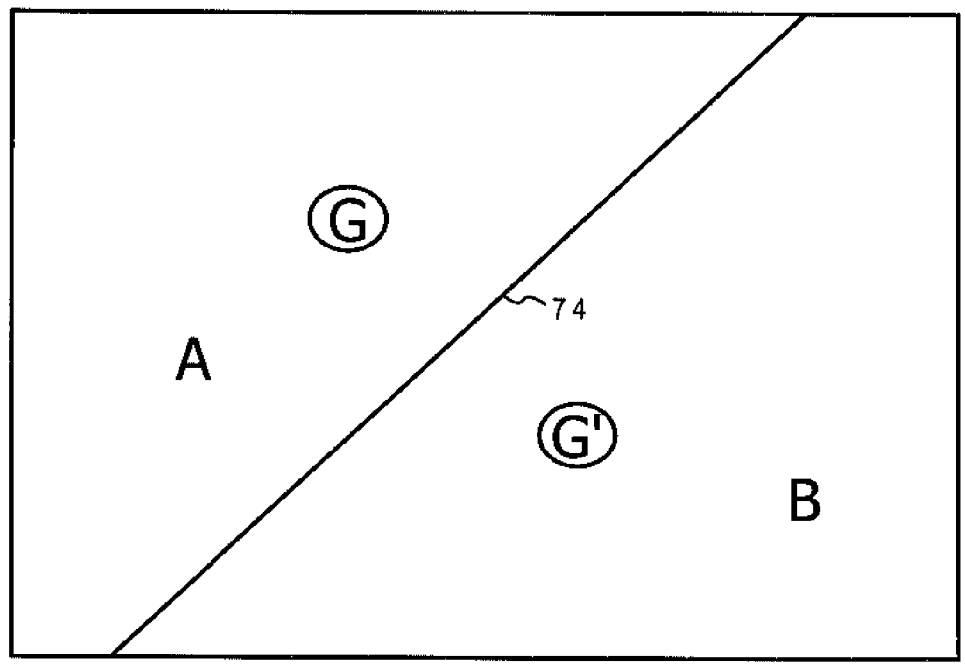
FIGS. 4A and 4B are plan views of the net region of the integrated circuit showing generalized Voronoi diagrams to illustrate sink partitioning techniques in accordance with the present invention.
Figure 4B:
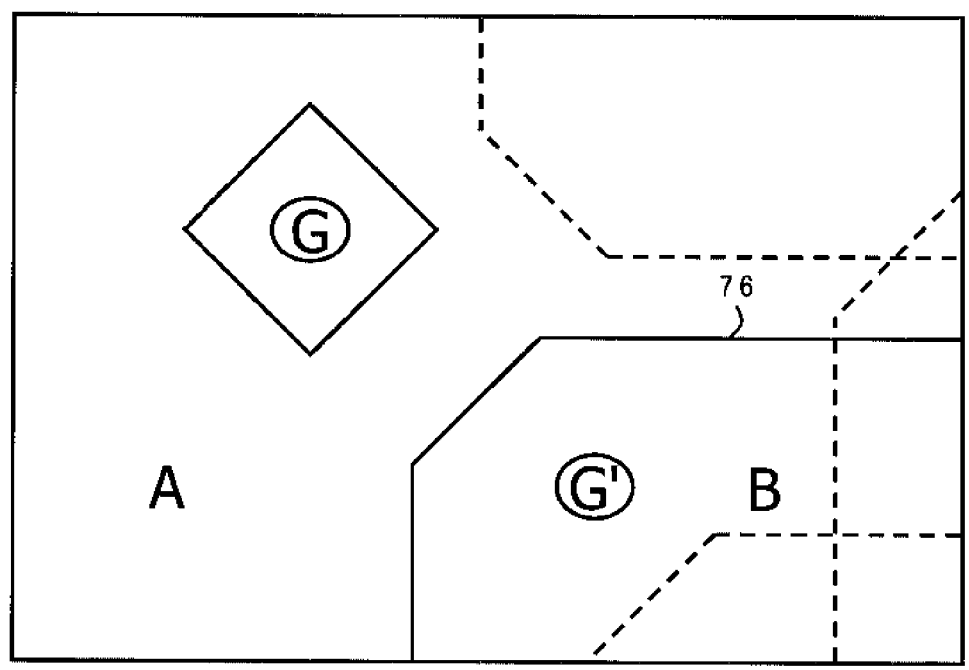

An initial problem for timing-driven cloning is how to determine the sinks for the cloned gate, i.e., how to partition the sinks. It is very time-consuming to compute worst slack or FOM for all possible partitions. The present invention may advantageously employ a more efficient method to find the partition that determines the sinks for the cloned gate in polynomial time instead of trying all possible combinations which takes exponential computation time. If the locations of the original gate and the cloned gate were known, the optimal partition would be the boundary of a Voronoi polygon defined by those two points or, for Manhattan space, defined by one of the points and a diamond inscribed in the unit circle around the other point as illustrated in FIGS. 4A and 4B. The Voronoi diagram is a well-known construct in computational geometry that divides a plane into regions such that exactly one point lies in each region. Given a set of points $a_i, \ldots, a_N$, a Voronoi polygon circumscribes all points that are closer to a given a than other $a_i$'s. In FIG. 4A, the boundary between the partitioned regions A and B is the line 74 which is equidistant at every point from the two gates G, G'. In FIG. 4B, the boundary between the partitioned regions A and B is the bent line 76. Any sinks in region A are to be driven by gate G and any sinks in region B are to be driven by gate G'.

For the Manhattan space implementation, boundary 76 can include the three line segments shown (vertical, diagonal, and horizontal), but it can also be rotated or consist of the diagonal line segment with only one of the horizontal or vertical line segments depending upon the location of the diamond region (the original gate) and the candidate location for the cloned gate, as indicated by the dashed lines in FIG. 4B. No matter where the original gate and cloned gate are placed, the preferred partition must be the boundary of a Voronoi polygon. Given a limited number of sinks, there are only a polynomial number of Voronoi polygons. Therefore all possible Voronoi polygons are iteratively constructed based on the locations of the sinks. The boundaries of the Voronoi polygons serve as cuts lines for determining valid partitions, i.e., only those partitions which conform to those boundaries are analyzed. This partitioning technique can be extended for multiple cloned gates to result in a partition having more than two clusters of sinks.

Figure 5:
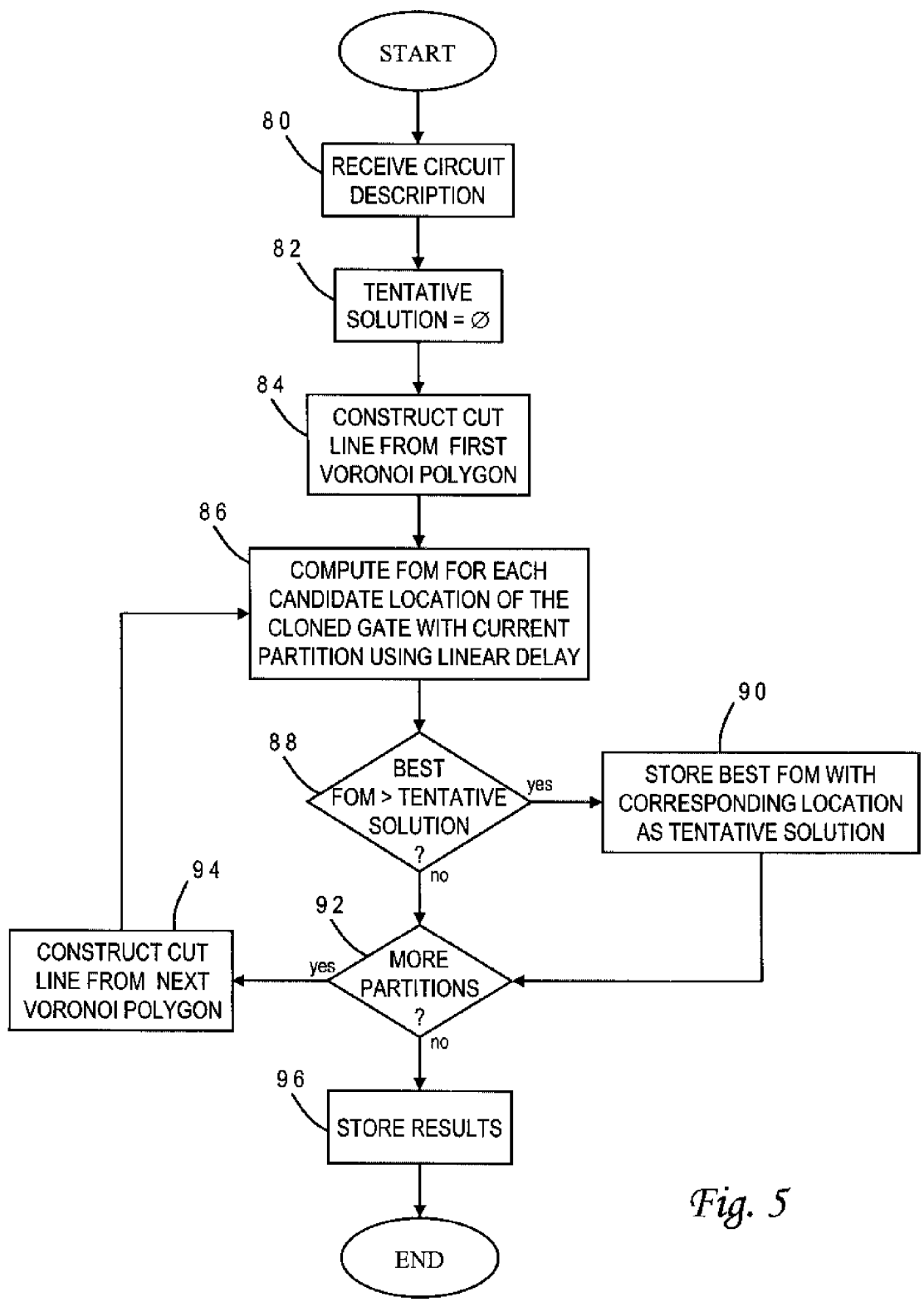
FIG. 5 is a chart illustrating the logical flow for timing-driven cloning in accordance with one implementation of the present invention.

The invention may be further understood with reference to the flow chart of FIG. 5. The process begins with receipt of the circuit description from the previous EDA tool (80). The circuit description includes the locations of the net's sources, gates, and sinks. The tentative solution is cleared, that is, set to null (82). The cut line for the first partition to be analyzed is constructed using a Voronoi polygon based on an initial location of the cloned gate (84). The figure of merit (for example but not limited to the worst slack, the sum of the sink slacks, or some combination thereof is computed for each candidate location of the cloned gate with the current partition using the linear delay model (86). The best FOM for the current partition is compared to the tentative solution (88). If the best FOM is greater than the tentative solution, it is stored with the corresponding location as a new tentative solution (90). If there are more partitions (92), another cut line is constructed from the next Voronoi diagram (94) and the process repeats iteratively at step 86. Once all of the valid partitions have been examined, the surviving tentative solution (the cloned gate location) is stored as the final solution of the timing-driven cloning (96). Other information may also be stored for further use by the designer, such as the computer slack values for the final solution.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the net of FIGS. 3A-3D has only one gate, this circuit is only a simplified example and the invention may be applied to more complicated nets having multiple gates. It is therefore contemplated that such modifications can be made without departing from the spirit or scope of the present invention as defined in the appended claims.

What is claimed is:

1. A computer-implemented method of cloning an original gate in a circuit design, comprising:
    receiving a description of the circuit design which includes locations for sources and sinks of the original gate, by executing first instructions in a computer system;
    iteratively partitioning the sinks into different sets of clusters wherein the original gate is assigned to a first one of the clusters in a given set and at least one cloned gate is assigned to at least a second one of the clusters in the given set, by executing second instructions in the computer system;
    for each set of clusters, computing a figure of merit for a location of the cloned gate which optimizes timing based on delay that is proportional to a distance between the cloned gate location and the location of a given sink in the second cluster, by executing third instructions in the computer system;
    selecting one of the sets of clusters having a highest figure of merit as a best solution, by executing fourth instructions in the computer system; and
    storing the description of the circuit design with a final location of the cloned gate corresponding to the best solution, by executing fifth instructions in the computer system.

2. The method of claim 1 wherein the description includes a location for the original gate, and further comprising changing the location of the original gate to a new location which optimizes timing based on delay that is proportional to the distance between the new location and the location of a given sink in the first cluster, by executing sixth instructions in the computer system.

3. The method of claim 1 wherein the sinks are partitioned using boundaries of Voronoi polygons defined by a diamond region surrounding the original gate.

4. The method of claim 1 wherein the figure of merit is worst slack.

5. The method of claim 1 wherein the figure of merit is a sum of slacks at the sinks in the second cluster.

6. The method of claim 1 wherein the figure of merit is a combination of worst slack and a sum of slacks at the sinks in the second cluster.

7. A computer system comprising:
    one or more processors which process program instructions;
    a memory device connected to said one or more processors; and
    program instructions residing in said memory device which receive a description of a circuit design having locations for sources and sinks of an original gate, iteratively partition the sinks into different sets of clusters wherein the original gate is assigned to a first one of the clusters in a given set and at least one cloned gate is assigned to at least a second one of the clusters in the given set, for each set of clusters compute a figure of merit for a location of the cloned gate which optimizes timing based on delay that is proportional to a distance between the cloned gate location and the location of a given sink in the second cluster, select one of the sets of clusters having a highest figure of merit as a best solution, and store the description of the circuit design with a final location of the cloned gate corresponding to the best solution.

8. The computer system of claim 7 wherein the description includes a location for the original gate, and said program instructions further change the location of the original gate to a new location which optimizes timing based on delay that is proportional to the distance between the new location and the location of a given sink in the first cluster.

9. The computer system of claim 7 wherein the sinks are partitioned using boundaries of Voronoi polygons defined by a diamond region surrounding the original gate.

10. The computer system of claim 7 wherein the figure of merit is worst slack.

11. The computer system of claim 7 wherein the figure of merit is a sum of slacks at the sinks in the second cluster.

12. The computer system of claim 7 wherein the figure of merit is a combination of worst slack and a sum of slacks at the sinks in the second cluster.

13. A computer program product comprising:
    a computer-readable storage medium; and
    program instructions residing in said storage medium which, when executed by a computer, receive a description of a circuit design having locations for sources and sinks of an original gate, iteratively partition the sinks into different sets of clusters wherein the original gate is assigned to a first one of the clusters in a given set and at least one cloned gate is assigned to at least a second one of the clusters in the given set, for each set of clusters compute a figure of merit for a location of the cloned gate which optimizes timing based on delay that is proportional to a distance between the cloned gate location and the location of a given sink in the second cluster, select one of the sets of clusters having a highest figure of merit as a best solution, and store the description of the circuit design with a final location of the cloned gate corresponding to the best solution.

14. The computer program product of claim 13 wherein the description includes a location for the original gate, and said program instructions further change the location of the original gate to a new location which optimizes timing based on delay that is proportional to the distance between the new location and the location of a given sink in the first cluster.

15. The computer program product of claim 13 wherein the sinks are partitioned using boundaries of Voronoi polygons defined by a diamond region surrounding the original gate.

16. The computer program product of claim 13 wherein the figure of merit is worst slack.

17. The computer program product of claim 13 wherein the figure of merit is a sum of slacks at the sinks in the second cluster.

18. The computer program product of claim 13 wherein the figure of merit is a combination of worst slack and a sum of slacks at the sinks in the second cluster.

* * * * *